(12) United States Patent
Douglas

(10) Patent No.: US 7,642,851 B2
(45) Date of Patent: Jan. 5, 2010

(54) VARIABLE GAIN AMPLIFIER INSENSITIVE TO PROCESS VOLTAGE AND TEMPERATURE VARIATIONS

(75) Inventor: Dale Scott Douglas, Atlanta, GA (US)

(73) Assignee: MetaLink Ltd., Yakum (IL)

( * ) Notice: Subject to any disclaimer, the term of this patent is extended or adjusted under 35 U.S.C. 154(b) by 0 days.

(21) Appl. No.: 11/767,678

(22) Filed: Jun. 25, 2007

(65) Prior Publication Data

US 2008/0315949 A1 Dec. 25, 2008

(51) Int. Cl.
*H03F 3/45* (2006.01)
(52) U.S. Cl. ........................ 330/254; 330/253
(58) Field of Classification Search .................. 330/253, 330/254, 258
See application file for complete search history.

(56) References Cited

U.S. PATENT DOCUMENTS 6,617,888 B2 * 9/2003 Volk ........................... 330/258
6,998,917 B2 * 2/2006 Kudo et al. .................. 330/258

OTHER PUBLICATIONS

D. Su and W. McFarland, "An IC for Linearizing RF Power Amplifiers Using Envelope Elimination and Restoration," *IEEE J. Solid-State Circuits*, vol. 33, pp. 2252-2258, Dec. 1998.
Takafumi Yamaji and Nobuo Kanou, "A Temperature-Stable CMOS Variable Gain Amplifier With 80-dB Linearly Controlled Gain Range" *J. Solid-State Circuits*, vol. 37, No. 5 pp. 553-558, May 2002.

* cited by examiner

*Primary Examiner*—Khanh V Nguyen
(74) *Attorney, Agent, or Firm*—Martin Fleit; Paul D. Bianco; Fleit Gibbons Gutman Bongini & Bianco PL

(57) ABSTRACT

An improved VGA design offering a purely ratiometric mechanism for controlling gain by current-steering. A control loop delivers a reference voltage to a control amplifier that steers current and match the common mode output voltage (CMOV) with said predefined reference voltage. The VGA is designed so that, although the absolute gain varies over process, voltage, and temperature (PVT), the gain steps retain their values. Moreover, a method for controlling the gain in a VGA in a way that is insensitive to PVT is also disclosed. First, a voltage representing the required gain of the VGA in injected to the outputs of the VGA. Then, the CMOV of the VGA is sampled. Finally, the CMOV is subtracted by a predefined reference voltage and is fed back as bias to bases of the transistors of the VGA, thus controlling it gain, until the CMOV and the reference voltage become equal.

13 Claims, 5 Drawing Sheets

(PRIOR ART)

VARIABLE GAIN AMPLIFIER INSENSITIVE TO PROCESS VOLTAGE AND TEMPERATURE VARIATIONS

FIELD OF THE INVENTION

The present invention relates in general to analog integrated circuits and more specifically, to variable gain amplifiers implemented in integrated circuits.

BACKGROUND OF THE INVENTION

Variable gain amplifiers (VGA) are widely used in communication systems, specifically in transceivers incorporating automatic gain control (AGC) loops. AGC loops are used to maintain controlled output signal levels despite changing input signal levels. Often, the gain control unit is implemented by current-steering transistors which are transistors that control the flowing of current throughout the circuit and whose steering ratio is determined by a negative feedback loop of some sort. Current steering transistors may be either bipolar transistors (BJTs) or field effect transistors (FETs) or the combination thereof which is very common in analog and mixed signals applications.

FIG. 1 shows a simplified schematic circuit diagram of a differential amplifier (possibly with variable gain) according to the prior art. The differential amplifier 100 has a negative input (IN_N) 110 and a positive input (IN_P) 120, a negative output (OUT_N) 130 and a positive output (OUT_P) 140. These signals may be voltages, currents, or powers; depending on the circuit. Additionally, the differential amplifier 100 has a gain control pin 150, whereby the gain of the differential amplifier 100 is proportional to a control signal on this pin. This control signal is generally a DC (zero frequency) signal to enable control simplicity, as opposed to the input and output signals, whose frequency is dependent on the application. The transfer function of differential amplifier 100 gain to control signal 150 amplitude, where amplifier gain is equal to the output signal level (i.e., the amplitude of the difference between the signals Out_N and Out_P) divided by the input signal level (In_N minus In_P), is generally nonlinear. A simple open loop control mechanism may be implemented with the transfer function 170, wherein the control signal 180 may be scaled by some gain or attenuation. Alternately, the transfer function 170 may be nonlinear, to implement some favorable relationship between the differential amplifier gain and the control signal 180, such as linear-in-dB. This differential amplifier may optionally employ a feedback loop in order to desensitize the output signal level to external perturbation and variations over process, temperature, and voltage, being comprised of the signal detector 160 and the transfer function 170, in conjunction with the differential amplifier 100. A signal detector 160 produces a zero frequency (DC) signal which is proportional to the amplitude of the signal at 130, 140. In a minimal configuration, the transfer function 170 may simply be a subtraction, realizing a simple negative feedback loop intended to make the output of the signal detector 160, and thus the signal levels at 130, 140 constant and equal to the control signal 180. More elaborately, the transfer function 170 may include some gain or attenuation to scale the control signal 180, or may be a nonlinear transfer function in order to implement some favorable relationship between the control signal 180 and the output signal levels at 130, 140, such as a linear-in-dB relationship.

Variations in semiconductor process, temperature, and/or voltage will, in general, produce variations in the slope of the transfer function of differential amplifier 100 gain to the amplitude of the control signal 180; henceforth the slope of this transfer function will be called control gain. In the open loop case, control gain variation is minimized by having the transfer function 170 vary over PVT in an inverse manner as differential amplifier 100. In the closed loop case, the transfer function of the signal detector 160 needs to vary minimally over PVT. Either of these are difficult to assure, in general.

A VGA with current steering feedback is described in D. Su and W. McFarland, "An IC for Linearizing RF Power Amplifiers Using Envelope Elimination and Restoration." *IEEE J. Solid-State Circuits*, vol. 33, pp. 2252-2258, December 1998. ("Su and McFarland"). This VGA is a radio frequency (RF) design that uses a multiplier-like structure with two differential amplifiers to ensure a constant DC bias point at the drains of the differential amplifiers. The VGA is operated in conjunction with a limiter which utilizes it for feeding into an envelope detector, while a control amplifier tries to keep the output of the envelope detector the same as a reference voltage. Thus, the VGA according to Su and McFarland implements a feedback in order to linearize its response. It has a constant output common mode level, but does not implement the gain control using common mode feedback. Additionally, this VGA provides poor performance in most RF aspects. It also cannot retain a linearized control if removed from the limiter and so it cannot be used standalone. Other methods of linearization, which employ control linearizing circuits, exist but are prone to variation and mismatch over process, voltage, and temperature.

A fundamental drawback of presently available designs is their tendency to vary in their performance significantly as a result of changes made in the integrated circuit (IC) fabrication process (W/L ratio in FET transistors, base area in BJT transistors etc.), voltage and temperature variations (hereinafter: PVT).

Takafumi Yamaji and Nobuo Kanou offer a partial solution for temperature variations in their article "A Temperature-Stable CMOS Variable Gain Amplifier With 80-dB Linearly Controlled Gain Range" *J. Solid-State Circuits*, vol. 37, No. 5 pp. 553-558, May 2002. ("Yamaji and Kanou").

Migrating from one process corner to another or operating in a different temperature/voltage region than the original design requirements may result in severe underperforming. Therefore, a controllable VGA that is robust enough to overcome process, voltage and temperature (PVT) variations may reduce development costs and shorten the time-to-market of new designs.

SUMMARY OF THE INVENTION

The present invention discloses an improved VGA design offering a purely ratiometric (the ratio between output input is determinable) mechanism for controlling gain by current-steering. The VGA comprises a differential amplifier with a common mode feedback control loop that is used to implement gain control. A control amplifier steers currents and matches the common mode output signal of the differential amplifier with the reference voltage. The VGA is designed so that, although the absolute gain varies over process, voltage, and temperature (PVT), the gain steps retain their values.

In some embodiments, a method for controlling gain in a VGA in a way that is insensitive to PVT is disclosed. First, a voltage (or current) representing the required gain level of the VGA in injected to the outputs of the VGA. Then, the common mode output of the VGA is sampled. Finally, the common mode output voltage subtracted by a predefined reference voltage is fed as a control signal, biasing the transistors of the VGA, thus controlling its gain. The VGA according to the present invention may be implemented as an integrated circuit (IC) with either FET transistors, BJT transistors or any combination thereof.

BRIEF DESCRIPTION OF DRAWINGS

The subject matter regarded as the invention wilt become more clearly understood in light of the ensuing description of embodiments herein, given by way of example and for purposes of illustrative discussion of the present invention only, with reference to the accompanying drawings (Figures, or simply "FIGS."), wherein.

Figure 1:
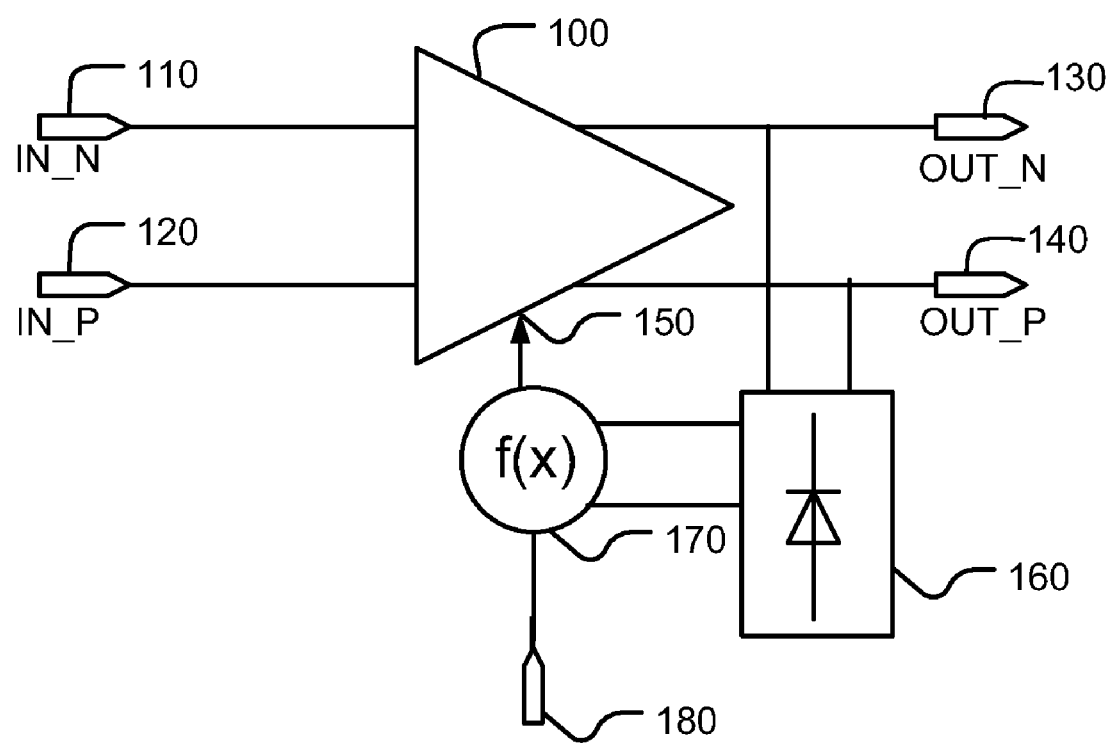
FIG. 1 is a schematic circuit diagram of a differential amplifier with a feedback loop according to the prior art.

The drawings together with the description make apparent to those skilled in the art how the invention may be embodied in practice.

In electronic circuit diagrams, conventional electronic components are labeled with conventional reference letters followed by a number indication the iteration of that element in the circuit. For example, R indicates a resistor, C indicates a capacitor, L indicated an inductor, Q indicates a bipolar transistor and M indicates a field-effect transistor. Each electronic component has a plurality of terminal through which it is connected to wires and other components. However the use of the word 'terminal' does not imply an implementation based on discrete components only, and any circuit described may be implemented as integrated circuit (IC). Further, where considered appropriate, reference numerals may be repeated among the figures to indicate corresponding or analogous elements.

DESCRIPTION OF SOME EMBODIMENTS OF THE INVENTION

Figure 2:
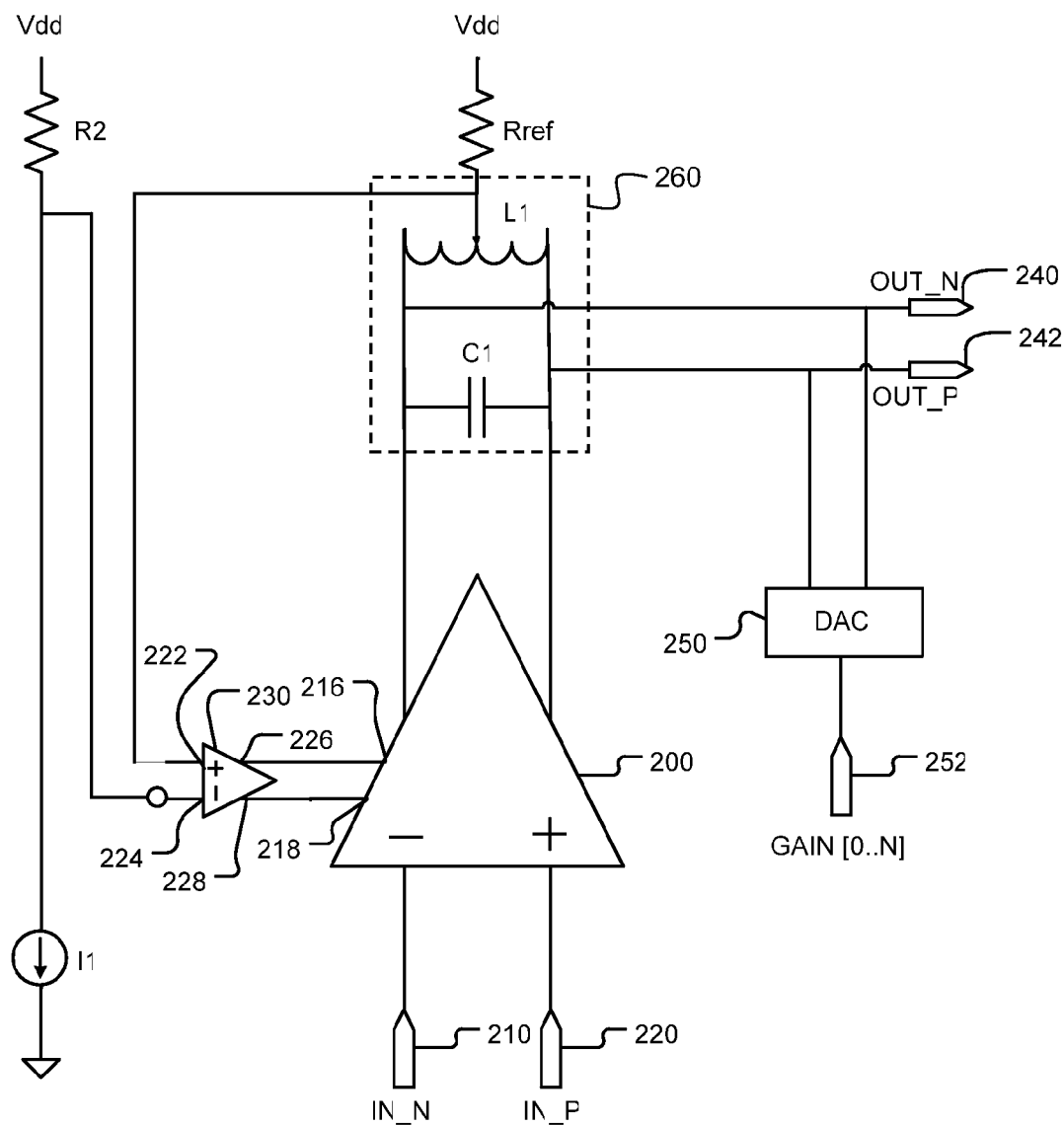
FIG. 2 is a schematic diagram of a variable gain amplifier, according to the present invention.

FIG. 2 shows a schematic diagram of the VGA according to the present invention. The disclosed invention is an improvement made to a current-steering VGA that is being controlled by a feedback loop. The VGA comprises a differential amplifier 200 with a negative input (IN_N) 210 and a positive input (IN_P) 220, a negative output (OUT_N) 240 and a positive output OUT_P 242, a negative control input 218 and a positive control input 216. The feedback is controlled by a control amplifier 230 which is a differential amplifier as well (and is referred to as control amplifier hereinafter for clarity purposes).

The control amplifier 220 comprises a negative input 224 and positive inputs 222 and a negative and positive output 228 and 226 respectively. The VGA further comprises a resonant load 260 connected in parallel tot the negative 240 and positive 242 outputs of the differential amplifier 200. The resonant load 260 may comprise a capacitor C1, and an inductor L1. The VGA further comprises a voltage rail Vdd (the on-chip highest voltage level supplied), a resistor Rref, a resistor R2, a current source having an input and an output I1, which is supplying a constant reference current through resistor R2. Gain control in the circuit is performed by a digital to analog converter (DAC) 230 comprising a digital input 232. The resistor R2 is connected in one end to the voltage rail Vdd and in the other end to the input of the current source I1 and to the negative input 224 of the control amplifier 230. The resistor Rref is connected in one end to the voltage rail Vdd and in the other end to the positive input 222 of the control amplifier 220 and to the resonant load 260. In case the resonant load is implemented with an inductor and a capacitor, the inductor L1 is connected at one end to one terminal of the capacitor C1 and to the negative output of the differential amplifier 210 and at the other end to the other terminal of the capacitor C1 and to the positive output of the differential amplifier 214. (The capacitor C1 is connected in parallel across the overall inductor L1.) The negative output 228 of the control amplifier 230 is connected to the negative control input of the differential amplifier 218, whereas the DAC 250 is connected to both the negative output 240 and the positive output 242 of the differential amplifier 200.

According to some embodiments, the resistance of resistor R2 is approximately between 5 times greater to 15 times greater than the resistance of resistor Rref. This helps keep the reference current low and therefore achieve low power consumption for the circuit.

Figure 3:
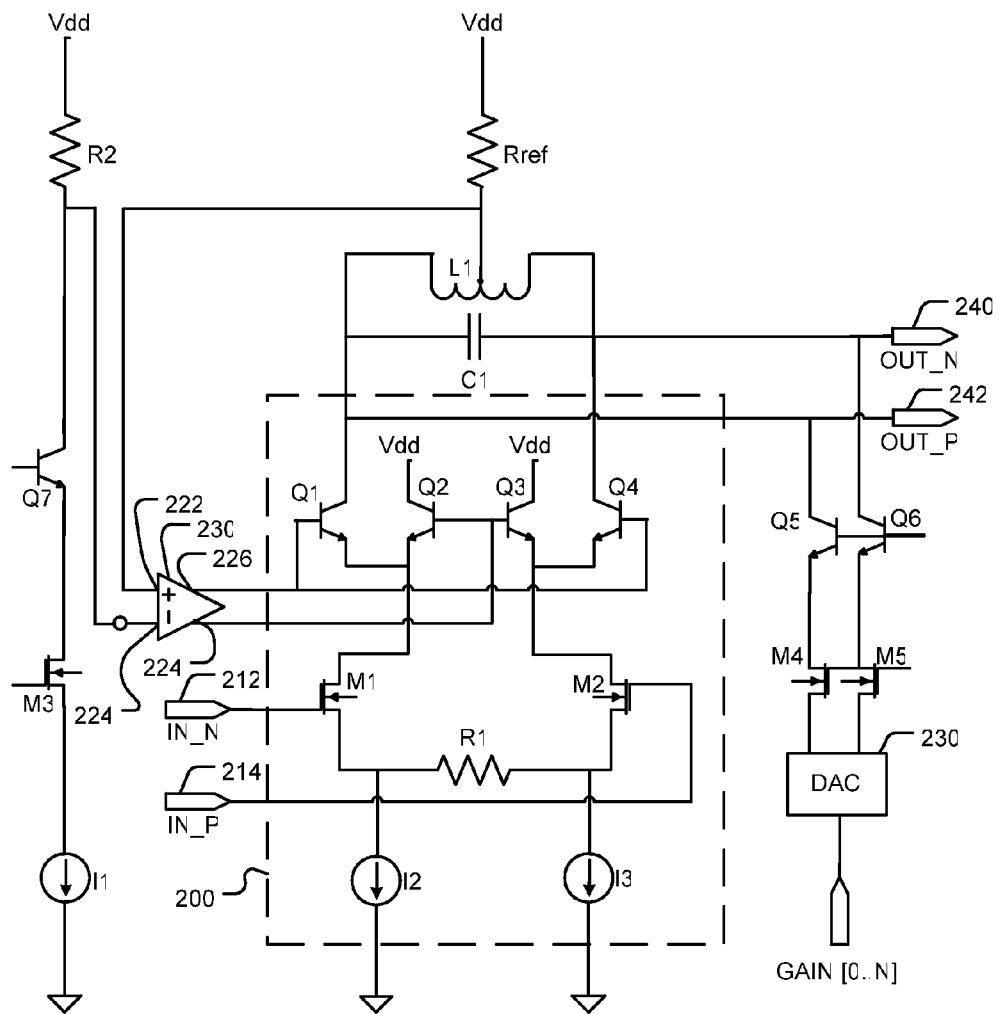
FIG. 3 is a more detailed schematic diagram of the variable gain amplifier of FIG. 2, according to the present invention.

FIG. 3 shows in more details the internal structure of the differential amplifier 200 according to some embodiments of the present invention. The present embodiment is simplified and only includes one gain stage. Other implementations may be practiced according to the present invention, and the present embodiment is disclosed as an example only. The differential amplifier 210 comprises two field effect transistors (FET) M1, M2, each having a source, a drain and gate terminals, and a resistor R1 is connected between their sources. These FET transistors M1, M2 serve as high impedance input terminals (M1 being the negative input and M2 being the positive input) for the differential amplifier 210. The differential amplifier 210 further comprises four bipolar transistors (BJT) Q1, Q2, Q3 and Q4, each having a collector, an emitter and base terminals.

The negative input 212 of the differential amplifier 210 is connected to the gate of the transistor M1, and the positive input 214 of the differential amplifier 214 is connected to the gate of the second FET M2. Further, the source of the transistor M1 is connected to the source of the transistor M2 via the resistor R1. Further, the emitter of the transistor Q1 is connected to the emitter of the transistor Q2 and to the drain of the transistor M1. The emitter of the transistor Q3 is connected to the emitter of the transistor Q4 and to the drain of the transistor M2. The base of the transistor Q2 is connected to the base of the transistor Q3 and to the negative output 228 of the control amplifier 220. Finally, the collector of the transistor Q1 and the collector of the transistor Q3 are connected to the voltage rail Vdd. The base of Q1 and Q4 is connected to the positive output 226 of the control amplifier 230. Additionally, the resistor R2 is connected to the current source I1 via at least one BJT transistor Q7 and at least one FET transistor M3, both biased to operate in the active region (biasing circuits not shown).

Upon operation, the control amplifier 220 adjusts the voltages at the bases of transistors Q1, Q2, Q3 and Q4 and thus steers current and ultimately changes the signal level at outputs 240 and 242 of the differential amplifier 210. The current steering is achieved by the control amplifier 230 as it is forced to match the reference voltage over resistor R2 with common mode output signal over resistor Rref. Finally, when the voltages are matched, the differential input of the control unit 222 minus 224 is zero and the circuit becomes steady again.

The gain control in the circuit is achieved by the DAC 230 which is connected through LET transistors M4, M5 and BJT transistors Q5, Q6 to the differential amplifier's outputs 240,

242. The transistors M4, M5, Q5, Q6 are biased by external circuitry (not shown) that are responsible of keeping these transistors in the active region of operation. Upon operation, the DAC generates A current proportional to the digital word Gain [n:0] from the differential amplifier's outputs 240, 242, before the common mode current sampling and so the gain of the VGA is set. Specifically, the control loop keeps the voltage constant, effectively keeping the DC current through resistor Rref constant. As it's the digital input (control word) of the DAC is increased it sinks more current, the control loop must steer more current away from the resonant load 260 and resistor Rref in order to keep this voltage constant. This current steering ratio also changes the signal output level.

According to all embodiments of the invention, the gain of the VGA is independent of PVT parameters, as shown hereinafter. The gain of the VGA is given in the following formula:

$$\text{Gain} = Gm(I) * \text{SteerRatio} * Rp \quad (1)$$

wherein Gm(I) is the net transcondutctance of the degenerated input FET transistors M1, M2, SteerRatio is the current steering ratio and wherein Rp is the equivalent parallel resistance of the resonant load 260 (L1, C1) at resonance. In the case that Rp tracks the resistor R3 over PVT, then a process independent gain, i.e., $$\frac{Rp}{R3} * \text{SteerRatio}$$

can be assumed. The gain may be given by the following formula:

$$Gm(I) = \frac{gm(I)}{(1 + gm(I) * R3)} \approx \frac{1}{R3} \quad (2)$$

wherein gm is the native transconductance of the FET transistors M1, M2 and wherein the resistor R3 tracks the resistors R1,R2 over PVT. The SteerRatio is determined by the feedback loop, in conjunction with the control DAC 250.

The nature of the loop and conducted by the control amplifier 230 is to keep the reference voltage and the output common mode voltage at the same value. Vref may be given by the following formula:

$$Vref = I1 * R2 = Iref^* \sim 16 Rref \quad (3)$$

Wherein Vref is the voltage across the resistor Rref, I1 is the current through resistor R1, and Iref is the current through resistor Rref. Vcm is the common mode voltage and is given by the following formula:

$$V_{CM} = [(I_2 - I_3) \cdot SR + I_{DAC} + I_{DACB}] \cdot R_{REF} = \left[ (8I_{REF} + 8I_{REF}) \cdot SR + 16 I_{REF} \cdot \left( \frac{b_N}{2} + \frac{b_{N-1}}{4} + \ldots + \frac{b_1}{2^{N-1}} + \frac{b_0}{2^N} \right) \right] \cdot R_{REF} \quad (4)$$

Wherein SR is the steer ration, and since Vref=Vcm, and given that all currents are derived from the same reference (e.g., Iref=Iref) and all resistors have good relative matching (e.g., Rref=Rref), the current steering ratio is given in the following formula:

$$\text{SteerRatio} = 1 - \left[ \frac{b_N}{2} + \frac{b_{N-1}}{4} + \ldots + \frac{b_1}{2^{N-1}} - \frac{b_0}{2^N} \right] \quad (5)$$

As apparent from formula (5), the current steering ratio is independent of the absolute accuracy of Rref or Iref and provided that Rp also tracks Rref over PVT, so is the gain.

Advantageously, the VGA according to the present invention may be implemented with FET transistors or bipolar transistor or any combination thereof. This further enhances the resilience of the design according to the present invention.

According to some embodiments of the invention, the VGA maintains the same incremental attenuation between adjacent values of Gain [n:0] over PVT. Although the gain of the VGA (the ratio between the amplitude of the signals at outputs 240, 242 and inputs 212, 214) may vary over PVT, as long as reference voltage over the resistor R2 and common mode output voltage over the resistor Rref vary in a proportional manner, the incremental attenuation remains constant.

According to other embodiments of the invention, the DAC 250 is a resistor DAC. It thus provides a voltage signal proportional to a digital gain value it receives and eliminates the current of the current DAC to reduce power consumption. According to the embodiment, the resistor Rref is replaced with the resistor DAC.

Figure 4:
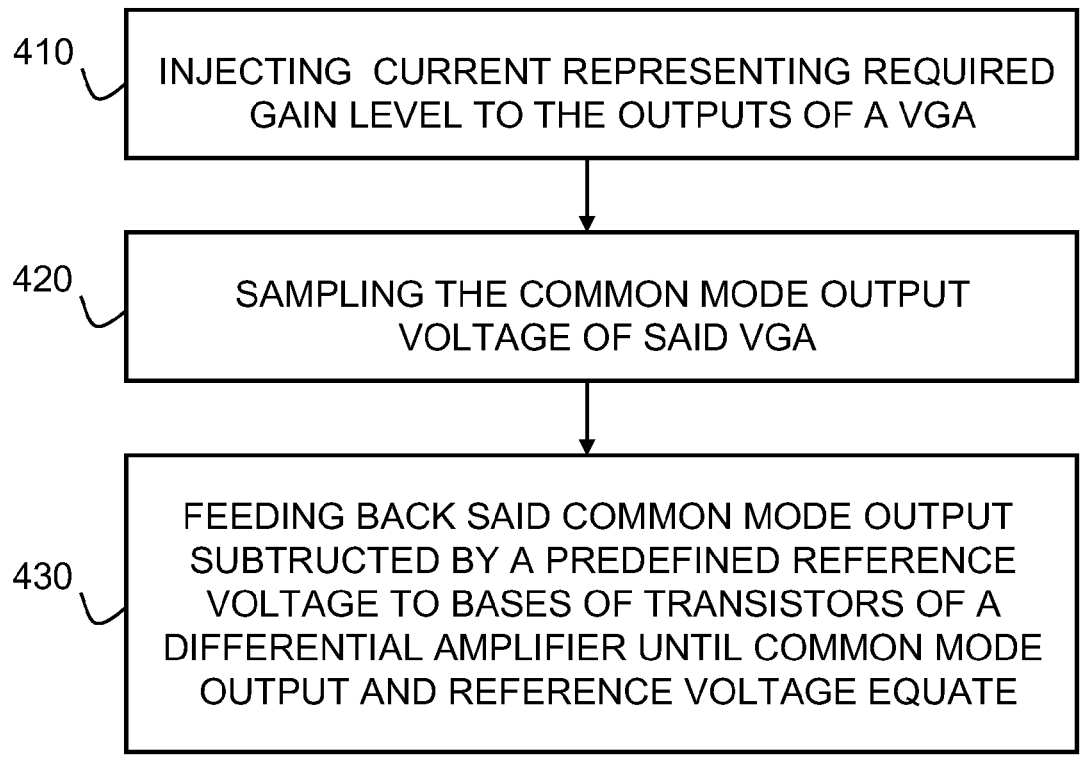
FIG. 4 shows a flowchart diagram detailing a method, according to the present invention.

FIG. 4 is a flowchart diagram showing a method for controlling a VGA according to some embodiments of the invention. In step 410, a voltage (or current) representing the required gain level of the VGA in injected to the outputs of the VGA. Then, in step 420, the common mode output of the VGA is sampled. Then, in step 430, the common mode output voltage subtracted by a predefined reference voltage is fed back as bias to bases of the transistors (Q1, Q2, Q3, Q4) of the VGA, thus controlling it gain, until the common mode output voltage and the reference voltage become equal.

Figure 5:
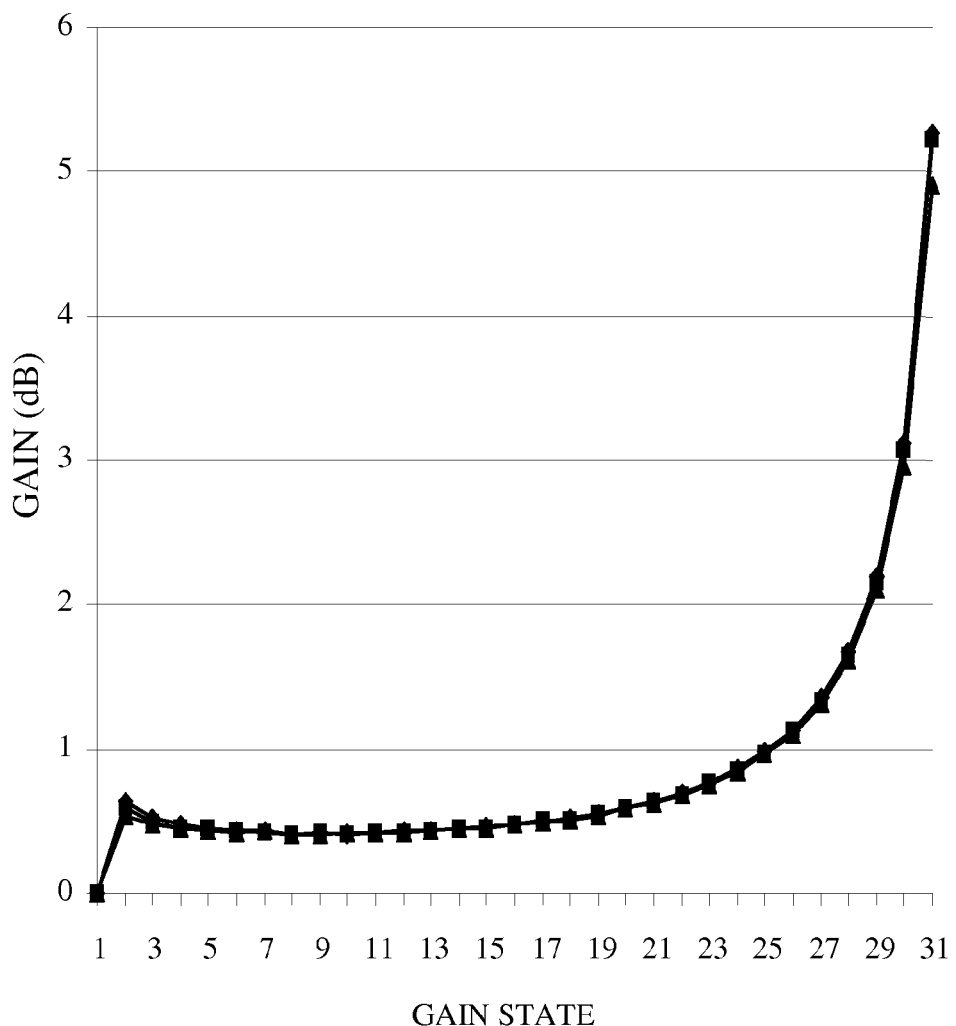
FIG. 5 shows simulation graphs of the variable gain amplifier of FIG. 2, according to the present invention.

Finally, FIG. 5 is a simulation graph that shows that the VGA according to present invention is insensitive to PVT variations. The graph shows the gain step (in dB) vs. the gain state (32 discrete states are shown) as set by the DAC 230 (5 bits word). Each of the 3 graphs (diamond, square, and triangle) represents a different PVT condition. As is evident from FIG. 5, all three graphs are aligned together.

In the above description, an embodiment is an example or implementation of the inventions. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions.

It is understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description below.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

The descriptions, examples, methods and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention can be implemented in the testing or practice with methods and materials equivalent or similar to those described herein.

Any publications, including patents, patent applications and articles, referenced or mentioned in this specification are herein incorporated in their entirety into the specification, to the same extent as if each individual publication was specifically and individually indicated to be incorporated herein. In addition, citation or identification of any reference in the description of some embodiments of the invention shall not be construed as an admission that such reference is available as prior art to the present invention.

While the invention has been described with respect to a limited number of embodiments, these should not be construed as limitations on the scope of the invention, but rather as exemplifications of some of the embodiments. Those skilled in the art will envision other possible variations, modifications, and applications that are also within the scope of the invention. Accordingly, the scope of the invention should not be limited by what has thus far been described, but by the appended claims and their legal equivalents. Therefore, it is to be understood that alternatives, modifications, and variations of the present invention are to be construed as being within the scope and spirit of the appended claims.

What is claimed is:

1. A variable gain amplifier (VGA), comprising:
   a first differential amplifier (DA) having a negative input and a positive input, a negative output and a positive output, and a control input;
   a second DA having a negative input and a positive input, and a negative output and a positive output;
   a resonant load connected in parallel to the outputs of the first DA;
   wherein the outputs of the first DA are connected to the positive input of the second DA through the resonant load and wherein a predefined reference current is injected to the negative input of the second DA; and wherein the outputs of the second DA are connected to the control input of the first DA; and
   wherein the second DA steers the currents until the voltage at the output of the first DA and the reference voltage become substantially equal.

2. The VGA according to claim 1, further comprising a digital to analog converter (DAC) having a digital input; wherein said DAC is connected to the outputs of the first DA.

3. The VGA according to claim 1, further comprising a first resistor and a second resistor, wherein the first resistor sample the output current of the first DA and wherein the second resistor samples the reference current.

4. The VGA according to claim 1, wherein the resonant load comprises at least on inductor and at least one capacitor, connected in parallel.

5. The VGA according to claim 1, wherein the output of the first DA is the common mode output.

6. The VGA according to claim 1, wherein the first DA comprises:
   a first and a second field effect transistors (FET), each having a source, a drain and a gate terminals;
   a first, second, third and fourth bipolar transistors (BJT), each having a collector, an emitter and a base terminals;
   a third resistor;
   wherein the negative input of the first DA is connected to the gate of the first FET and the positive input of the first DA is connected to the gate of the second FET; and
   wherein the source of the first FET is connected to the source of the second FET via the third resistor; and
   wherein the emitter of the first BJT is connected to the emitter of the second BJT and to the drain of the first FET; and
   wherein the emitter of the third BJT is connected to the emitter of the fourth BJT and to the drain of the second FET; and
   wherein the base of the second BJT is connected to the base of the third BJT and to the negative output of the second DA; and
   wherein the collector of the second BJT and the collector of the third BJT are connected to the voltage rail.

7. The VGA according to claim 1 wherein the VGA is designed to operate insensitively in terms of at least one of the following: fabrication process variations, voltage variations, temperature variations.

8. The VGA according to claim 3 wherein the resistance of the first resistor is approximately between 5 times greater to 15 times greater than the resistance of the second resistor.

9. The VGA according to claim 3 wherein the second resistor is connected to the input of the current source via at least one BJT and at least one FET.

10. The VGA according to claim 2 wherein the DAC converts a digital word into a corresponding current value which is injected to the negative and positive outputs of the first DA.

11. The VGA according to claim 6, further comprising a digital to analog converter (DAC) having a digital input; wherein said DAC is connected to the outputs of the first DA; and wherein the first and the second outputs of the DAC are connected to the negative output and the positive output of the first DA, respectively, via at least one biased FET and at least one biased BJT.

12. The VGA according to claim 2 wherein the DAC is a resistor DAC connected directly to the outputs of the first DA and wherein said resistor DAC produces a voltage according to a digital word gain value.

13. The VGA according to claim 1 wherein the VGA is implemented with at least one of the following transistors: FET, BJT, a combination thereof.

* * * * *